United States Patent [19]

Okuyama

[11] Patent Number: 4,947,379
[45] Date of Patent: Aug. 7, 1990

[54] HIGH SPEED STATIC RANDOM ACCESS MEMORY CIRCUIT

[75] Inventor: Hiroaki Okuyama, Kyoto, Japan

[73] Assignee: Matsushita Electronics Corporation, Osaka, Japan

[21] Appl. No.: 207,650

[22] Filed: Jun. 16, 1988

[30] Foreign Application Priority Data

Jun. 22, 1987 [JP] Japan ................................. 62-154745

[51] Int. Cl.$^5$ ................................................ G11C 7/00
[52] U.S. Cl. .................................... 365/233.5; 365/227
[58] Field of Search ..................... 365/233, 233.5, 241, 365/203, 194; 307/269

[56] References Cited

U.S. PATENT DOCUMENTS

| | | | |
|---|---|---|---|
| 4,641,044 | 2/1987 | Shiraishi | 307/269 |
| 4,701,889 | 10/1987 | Ando | 365/203 |
| 4,707,809 | 11/1987 | Ando | 365/233.5 |
| 4,712,194 | 12/1987 | Yamaguchi et al. | 365/233.5 |
| 4,728,820 | 3/1988 | Lee | 307/269 |

Primary Examiner—Stuart N. Hecker
Assistant Examiner—Michael A. Whitfield
Attorney, Agent, or Firm—Wenderoth, Lind & Ponack

[57] ABSTRACT

A static random access memory (RAM) circuit arranged such that the data stored in a memory cell is readout by detecting a transition address signal level. That is, an address transition pulse is generated by detecting an address signal transition, and first and second pulses are generated by detecting a starting edge and a trailing edge of the address transition pulse respectively. The first pulse enables a selected word line for reading out the data stored in selected memory cells. The second pulse enables an data output circuit coupled to the bit lines for transferring the readout data to an output terminal. Under such an arrangement, memory access operation becomes faster, and even if "skew" phenomenon is caused, the transient data readout from the memory cells instantaneously is prevented from being transferred to the output terminal.

3 Claims, 4 Drawing Sheets

HIGH SPEED STATIC RANDOM ACCESS MEMORY CIRCUIT

BACKGROUND OF THE INVENTION

This invention relates to a static random access memory (RAM) circuit, especially a static RAM circuit in which the data stored in a memory cell is read out by detecting the transition of an address signal level.

FIG. 3 shows a block diagram of a conventional static RAM circuit and FIG. 4 shows the timing chart thereof.

In FIGS. 3 and 4, in order to simplify the structure, only two address signals and only one memory cell are shown. Address signals $AD_0$ and $AD_1$ from the input terminals 1 and 2 are supplied to an address decoder 3 and a detecting pulse generator 4. The address decoder 3 is comprised of two inverters $I_1$ and $I_2$ and four AND gates $A_1$–$A_4$, and word line selection signals $\overline{AD_0} \cdot \overline{AD_1}$, $\overline{AD_0} \cdot AD_1$, $AD_0 \cdot \overline{AD_1}$ and $AD_0 \cdot AD_1$ from the AND gates $A_1$, $A_2$, $A_3$ and $A_4$ are supplied to one input terminal of AND gates $A_5$, $A_6$, $A_7$ and $A_8$ respectively. These word line selection signals select any one of a plurality of word lines sequentially. The detecting pulse generator 4 is comprised of two detecting circuits $D_0$ and $D_1$ and an OR gate $O_1$. The detecting circuit $D_0$ detects a transition of the level of the address signal $AD_0$. That is, when the address signal $AD_0$ changes from an "H" level to an "L" level or an "L" level to an "H" level, the detecting circuit $D_1$ detects such a transition and generates an address transition pulse ($ATP_0$) as shown in FIG. 4. The detecting circuit $D_1$ detects a transition of the level of the address signal $AD_1$ in the same fashion as that of the detecting circuit $D_0$ and generates an address transition pulse ($ATP_1$). As a result, an address transition pulse (ATP) is delivered from the OR gate $0_1$ as shown in FIG. 4. The pulse width of the address transition pulse (ATP) is equal to the sum of the pulse width of the address transition pulses $ATP_0$ and $ATP_1$. A word line enable pulse generator 5 detects a trailing edge of the address transit pulse (ATP) and generates a word line enable pulse (WLE) as shown in FIG. 4. The word line enable pulse (WLE) is supplied to another input terminal of the AND gates $A_5$–$A_8$. Consequently, any one of a plurality of word lines ( word line 6 in this case) selected by the AND gates $A_5$–$A_8$ is enabled as shown in FIG. 4 "WL". On the other hand, the word line enable pulse (WLE) is supplied to the data transfer circuit 7 and the sense amplifier 8. Therefore, these circuits 7 and 8 are enabled at the same time when the selected word line 6 is enabled. When the selected word line 6 is enabled, the data stored in the memory cell 9 is readout to a bit line 10a so that the difference of the signal level between a pair of bit lines 10a and 10b as shown in FIG. 4 "BL" may be detected. The level difference between the bit lines 10a and 10b is transferred to a sense amplifier 8 as readout data through a data transfer circuit 7. The data is amplified by the sense amplifier 8, and the sense amplifier outputs (SAO, $\overline{SAO}$) shown in FIG. 4 as "SAO" are supplied to an output buffer 11 and latched by the output buffer 11. After that, the output data (DATA) is supplied to the output terminal 12. When the word line enable pulse (WLE) terminates, the selected word line 6, the data transfer circuit 7 and the sense amplifier 8 are disabled, and the sense amplifier outputs (SAO, $\overline{SAO}$) disappear. However, since the sense amplifier outputs (SAO, $\overline{SAO}$) are latched by the output buffer 11, the output data (DATA) supplied to the output terminal 12 does not disappear after the extinction of the sense amplifier outputs (SAO, $\overline{SAO}$) as shown in FIG. 4. When the word line enable pulse (WLE) terminates, all word lines, the data transfer circuit 7 and the sense amplifier 8 are disabled, and therefore, there is no waste of unnecessary current in the memory cells, the data transfer circuit 7 and the sense amplifier 8. Thus, the total current consumption is reduced.

Meanwhile, in FIGS. 3 and 4, only two address signals $AD_0$ and $AD_1$ and only one memory cell 9 are shown. However, in practical static RAM circuits, a plurality of memory cells are arranged in matrix, and a plurality of address signals are supplied to the input terminals so as to sequentially select necessary memory cells from among a plurality of memory cells.

As mentioned above, in a conventional static RAM circuit, the word line enable pulse (WLE) is generated by detecting the edge of the address transition pulse (ATP). The reason is as follows. In a practical static RAM circuit, the address signals ($AD_0$, $AD_1$, etc.) are often delayed from the predetermined timing because of parasitic capacitance, etc. This phenomenon is called "skew". When "skew" is caused, the pulse timing of the address transition pulses ($ATP_0$, $ATP_1$) are delayed, and the pulse timing of the address transition pulse (ATP) is also delayed according to the delay of the transition timing of the address signals ($AD_0$, $AD_1$, etc.). In order to avoid such "skew" phenomenon, in a conventional static RAM circuit, after receiving the transitions of all necessary address signals, in other words, after detecting the edge of the address transit pulse (ATP), the word line enable pulse (WLE) is generated.

However, under such a construction, the word line enabling timing (i.e. the term "$t_2$" in FIG. 4) is not determined by the operation speed of the address decoder 3 but determined by that of the detecting pulse generator 4 and the word line enable pulse generator 5. In order to shorten the term "$t_2$", even if these generators 4 and 5 are designed to operate at high speed, so long as the word line enable pulse (WLE) is generated by detecting the trailing edge of the address transition pulse (ATP), it takes quite a bit time to generate the word line enable pulse (WLE). Therefore, in a conventional static RAM circuit, it is difficult to shorten the access time and to achieve a high speed operation.

SUMMARY OF THE INVENTION

It is a first object of this invention to present a static RAM circuit capable of a high speed operation.

It is a second object of this invention to present a static RAM circuit which can avoid an undesirable operation caused by "skew" phenomenon without making a sacrifice of a its high speed operation.

It is a third object of this invention to present a static RAM circuit which can reduce unnecessary current consumption.

This invention may be briefly summarized as a static RAM circuit wherein a word line enable pulse (WLE) is generated by detecting a starting edge of an address transit pulse (ATP). By this construction, the word line enabling timing can be made faster than that of a conventional static RAM circuit, and a higher speed operation is realized. Furthermore, in a static RAM circuit of this invention, another enable pulse is generated by detecting a trailing edge of the address transit pulse (ATP), and said another enable pulse is supplied to a data output circuit coupled to the bit lines in a memory cell matrix so as to prevent from transferring the data readout by the "skew" phenomenon and to transfer a data readout from a memory cell selected and enabled by a definite transition of an address signal.

Other features and objects of the present invention will be apparent from the following description in connection with the accompanying drawings.

DETAILED DESCRIPTION OF THE INVENTION

Figure 1:
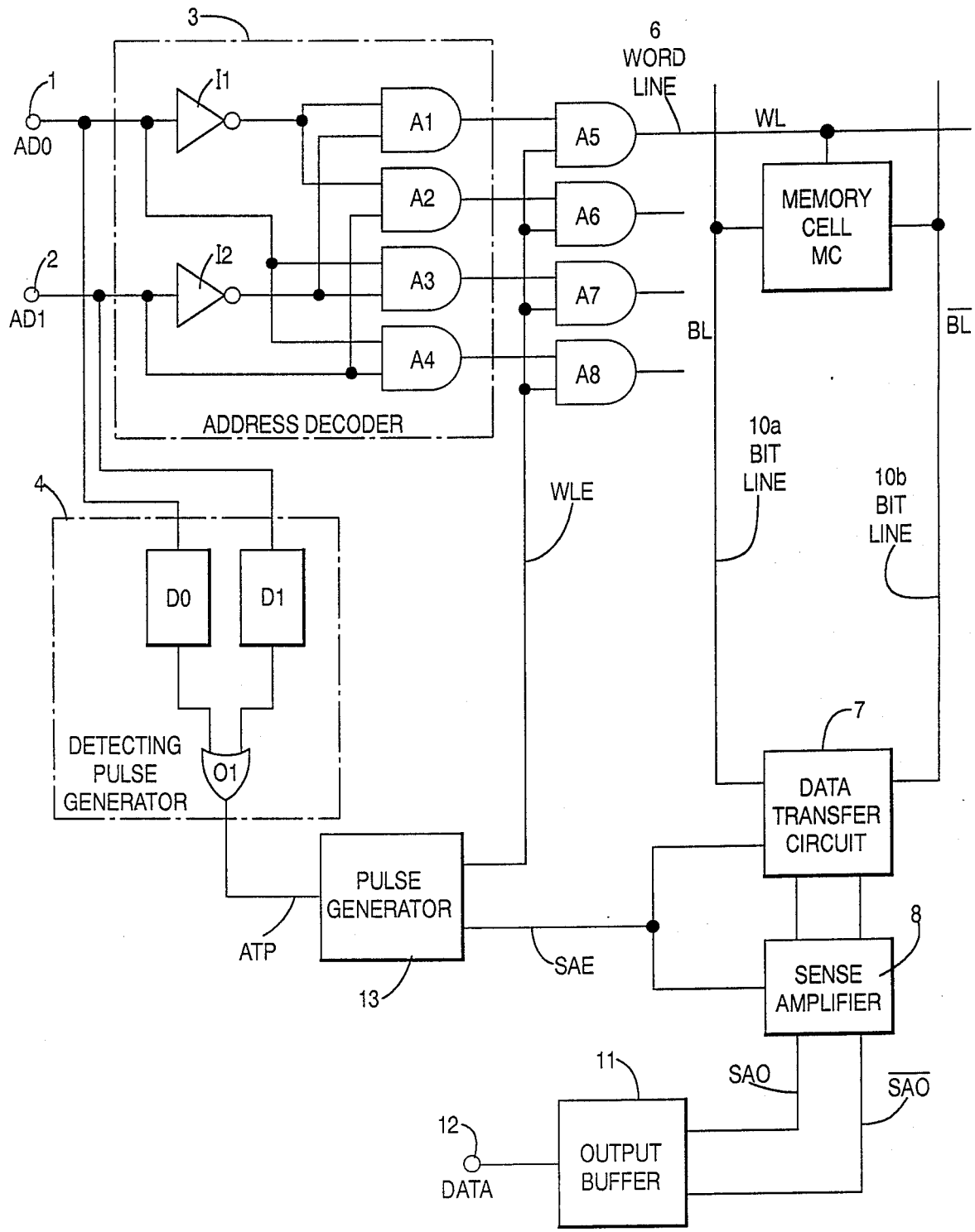
FIG. 1 is a block diagram of one embodiment of a static RAM circuit of this invention.
Figure 2:
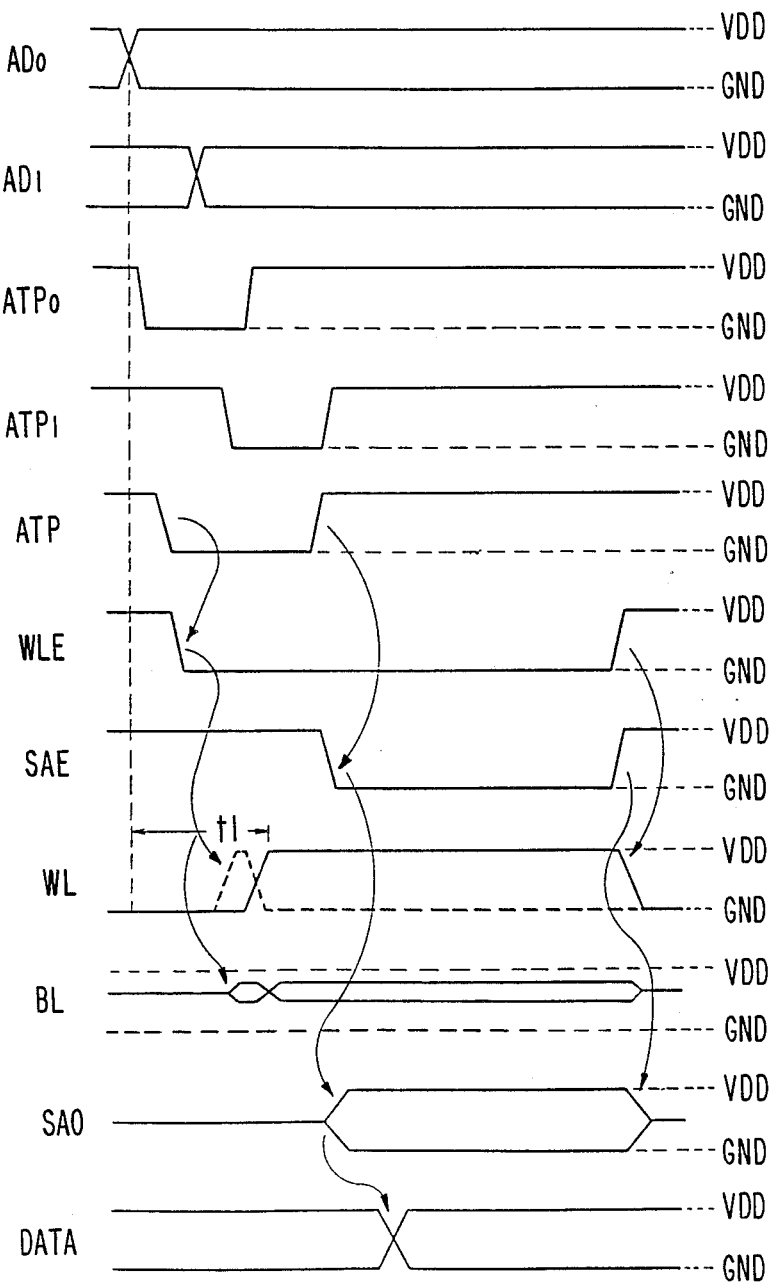
FIG. 2 is a timing chart of a static RAM circuit shown in FIG. 1.

FIG. 1 shows an embodiment of the static RAM circuit and FIG. 2 shows a timing chart of the static RAM circuit shown in FIG. 1.

Figure 3:
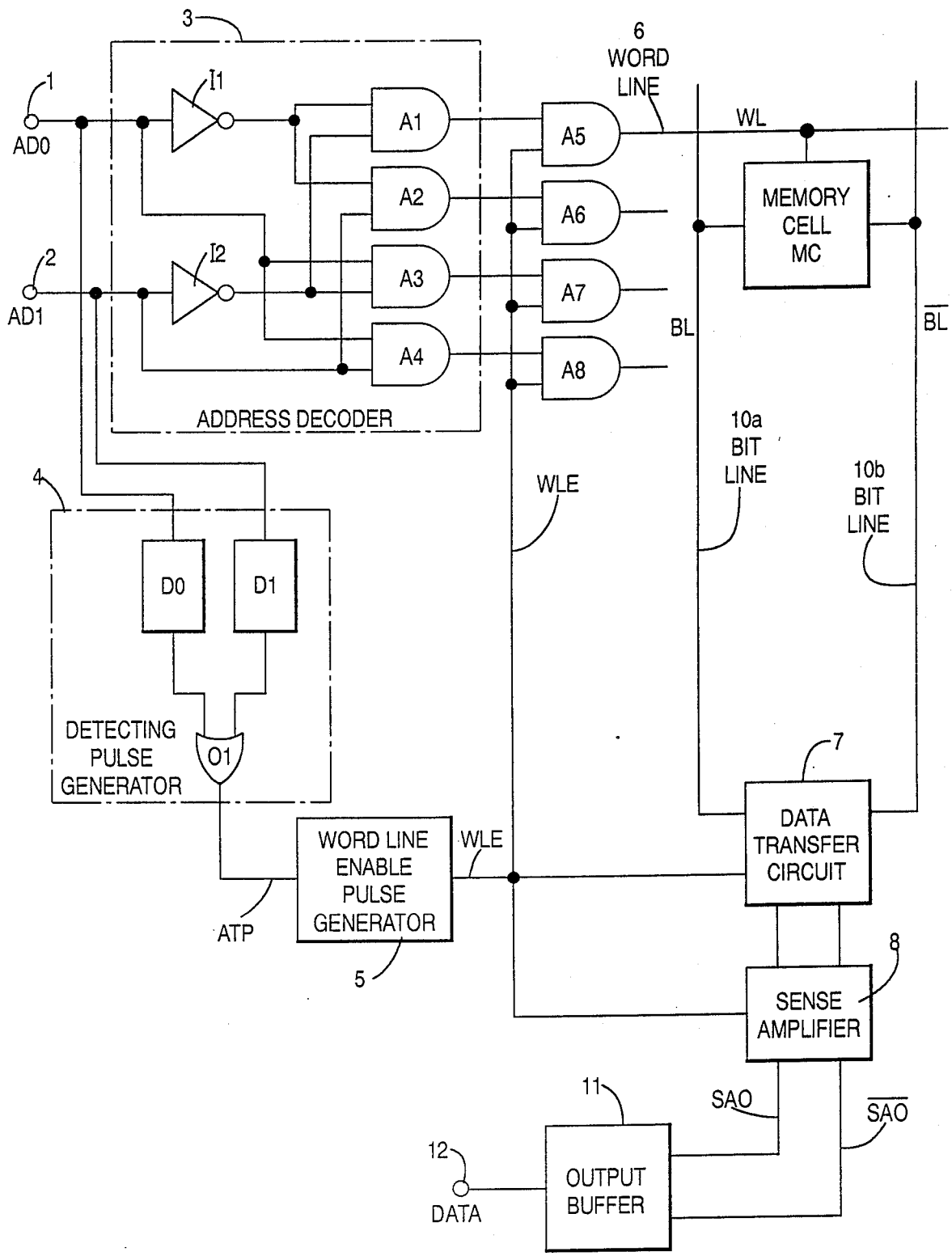
FIG. 3 is a block diagram of a conventional static RAM circuit.

In FIG. 1, the blocks given the reference number 1–4 and 6–12 have substantially the same function as that of a conventional static RAM circuit shown in FIG. 3. The detailed construction and operation of this embodiment are as follows. Address signals $AD_0$ and $AD_1$ are decoded by the address decoder 3, and word line selection signals are supplied to one input terminal of the AND gates $A_5$, $A_6$, $A_7$ and $A_8$ respectively for selecting any one of a plurality of word lines sequentially. On the other hand, the detecting pulse generator 4 detects transitions of the address signals $AD_0$ and $AD_1$ and generates an address transition pulse (ATP). A pulse generator 13 detects a starting edge of the address transition pulse (ATP) and generates a word line enable pulse (WLE). Furthermore, the pulse generator 13 detects a trailing edge of the address transition pulse (ATP) and generates a sense amplifier enable pulse (SAE) as shown in FIG. 2. The word line enable pulse (WLE) is supplied to another input terminal of the AND gates $A_5$, $A_6$, $A_7$ and $A_8$. As a result, any one of a plurality of word lines (word line 6 in this case) selected by the word line selection signals is enabled by the word line enable pulse (WLE). At this time, if "skew" is caused, before the word line 6 is selected and enabled by corresponding definite transition of an address signal, other word lines are selected and enabled instantaneously one by one because the word line enable pulse (WLE) is generated by the starting edge of the address transition pulse (ATP). A dotted line illustrated in FIG. 2 "WL" shows the changing of the word line potential caused by such a transient word line selection. In such a case, memory cells corresponding to the selected word lines are accessed instantaneously, and the data stored in these memory cells are readout to the corresponding bit lines. Accordingly, the level difference is brought about between each pair of bit lines as shown in FIG. 2 "BL". However, in general, the amplitude of the bit line signal is rather small. Therefore, it does not take a long time to bring about a desired level difference between a pair of bit lines caused by a readout data from the memory cell selected, and enabled by a definite transition of an address signal. Furthermore, at this moment, the sense amplifier enable pulse (SAE) has not been delivered from the pulse generator 13. Accordingly, both the data transfer circuit 7 and the sense amplifier 8 are still disabled, and therefore, the data instantaneously readout by "skew" phenomenon are not transferred to the output buffer 11. The pulse generator 13 generates the sense amplifier enable pulse (SAE) by detecting a trailing edge of the address transition pulse (ATP), and the data transfer circuit 7 and the sense amplifier 8 are enabled by the sense amplifier enable pulse (SAE). At this moment, the word line 6 has been selected and enabled by the definite transition of the address signal as shown in FIG. 2 "WL", and the data stored in the memory cell 9 has been readout to the bit line 10a. Therefore, the level difference between a pair of bit lines 10a and 10b is transferred to the sense amplifier 8 and amplified. The sense amplifier outputs (SAO, $\overline{SAO}$) are supplied to the output buffer 11 and latched. When the word line enable pulse (WLE) terminates, all the word lines are disabled. When the sense amplifier enable pulse (SAE) terminates, both the data transfer circuit 7 and the sense amplifier 8 are disabled, and the output signals (SAO, $\overline{SAO}$) of the sense amplifier 8 disappear. However, at this moment, since the sense amplifier outputs (SAO, $\overline{SAO}$) have been latched to the output buffer 11, the output data (DATA) supplied to the output terminal 12 is maintained after the extinction of the sense amplifier outputs (SAO, $\overline{SAO}$). Therefore, there is no waste of unnecessary current in the memory cells, the data transfer circuit 7 and the sense amplifier 8. Thus, the total current consumption is reduced.

As mentioned above, in this embodiment, the selected word line is enabled by the word line enable pulse (WLE) generated by detecting the starting edge of the address transition pulse (ATP). Therefore, the term "$t_1$" shown in FIG. 2 can be shortened, and thereby, it becomes possible to achieve a higher speed access operation. Furthermore, the circuits such as the data transfer circuit 7 or the sense amplifier 8 which follow the bit lines 10a and 10b are enabled by the sense amplifier enable pulse (SAE) generated by detecting the trailing edge of the address transition pulse (ATP). Accordingly, even if "skew" is caused, and the data stored in the memory cells are readout instantaneously, this transient data is prevented from being transferred to the output buffer 11. As a result, it is possible to keep a constant access time regardless of the "skew" phenomenon. Furthermore, after the word line enable pulse (WLE) and the sense amplifier enable pulse (SAE) terminate, all word lines and the data output circuits 7 and 8 coupled to the bit lines 10a and 10b are disabled respectively. Therefore, the total current consumption is considerably reduced.

Figure 4:
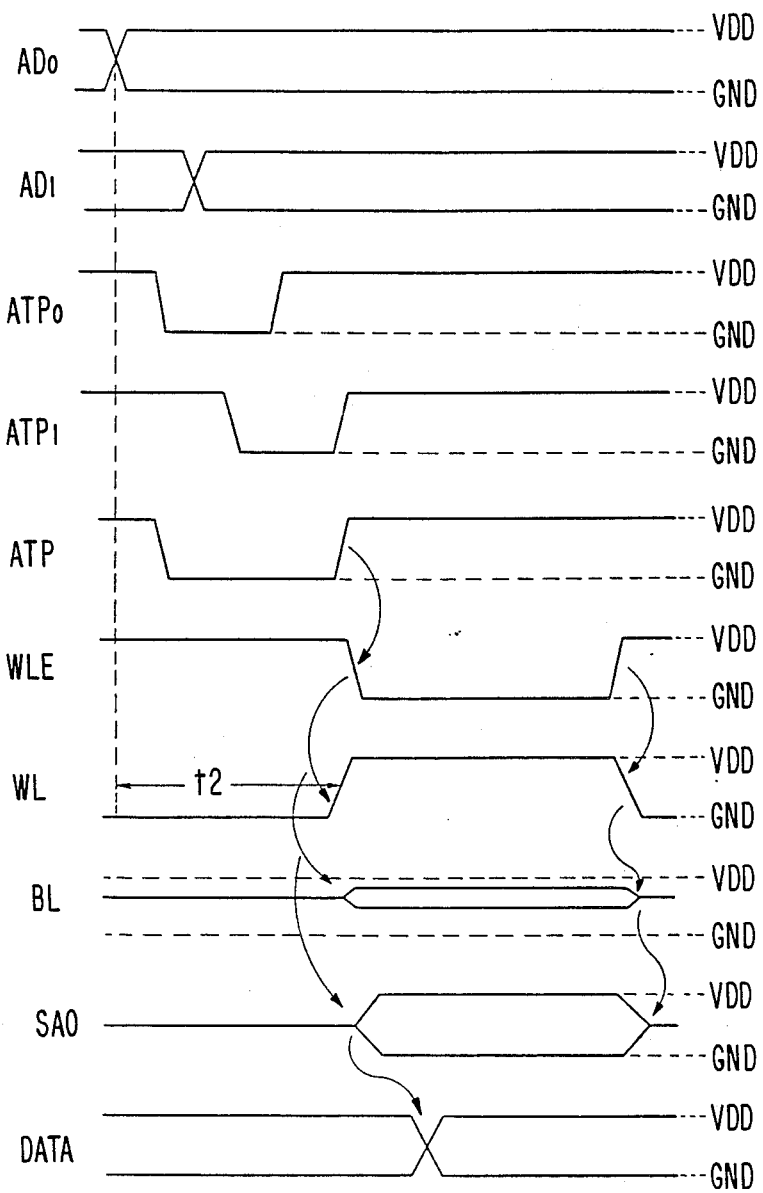
FIG. 4 is a timing chart of a conventional static RAM circuit shown in FIG. 3.

Meanwhile, in FIGS. 1 and 2, as well as in FIGS. 3 and 4, only two address signals $AD_0$ and $AD_1$ and only one memory cell 9 are shown in order to simplify the construction and the operation. However, in a practical static RAM circuit, a plurality of memory cells are arranged in a matrix, and a plurality of address signals are supplied to the input terminals so as to sequentially select any one of said plurality of memory cells.

What is claimed is:

1. A static random access memory circuit comprising:
   a plurality of memory cells for storing data arranged in matrix;
   a plurality of word lines for selecting said plurality of memory cells;

a plurality of bit lines for transferring the data readout from said plurality of memory cells;

a data output means coupled to said plurality of bit lines for supplying the data transferred from said plurality of bit lines to output terminals;

address decode means for decoding address signals and generating a plurality of word line selection signals for selecting any one of said plurality of word lines sequentially;

a detecting pulse generating means for detecting the transition of the level of said address signals and generating an address transition pulse;

a pulse generating means for generating a first pulse by detecting a start edge of said address transition pulse and for generating a second pulse by detecting a trailing edge of said address transition pulse;

a means for selecting any one of said plurality of word lines by one of said plurality of word line selection signals and for enabling said selected word line by said first pulse so that the data stored in the selected memory cells are readout to the corresponding bit lines from among said plurality of bit lines; and a means for enabling said data output means by said second pulse.

2. A static random access memory circuit according to claim 1, wherein all of said word lines are disabled by detecting a trailing edge of said first pulse.

3. A static random access memory circuit according to claim 1, wherein said data output means comprise:

a data transfer circuit coupled to said plurality of bit lines for transferring the data on said plurality of bit lines;

a sense amplifier for amplifying said data transferred from said data transfer circuit;

an output buffer for latching said data supplied from said sense amplifier and for supplying said latched data to said output terminals; and a means for supplying said second pulse to said data transfer circuit and said sense amplifier so that said data transfer circuit and said sense amplifier are disabled after extinction of said second pulse and said data is kept latching by said output buffer after extinction of said second pulse.

* * * * *